(12) United States Patent
Hanamura

(10) Patent No.: US 8,698,157 B2
(45) Date of Patent: Apr. 15, 2014

(54) ELECTRO-OPTICAL APPARATUS AND ELECTRONIC APPARATUS

(75) Inventor: Yoshikazu Hanamura, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/613,954

(22) Filed: Sep. 13, 2012

(65) Prior Publication Data

US 2013/0082269 A1    Apr. 4, 2013

(30) Foreign Application Priority Data

Oct. 3, 2011   (JP) .................................. 2011-218978

(51) Int. Cl.
*H01L 27/13*    (2006.01)

(52) U.S. Cl.
USPC .................. 257/71; 257/59; 257/72; 257/203; 349/147; 349/114

(58) Field of Classification Search
USPC ........... 257/59, 72, 203, 71, 79; 349/114, 147
See application file for complete search history.

(56) References Cited

U.S. PATENT DOCUMENTS

| | | | |
|---|---|---|---|
| 7,199,853 B2 * | 4/2007 | Koide | ............................ 349/147 |
| 7,791,695 B2 | 9/2010 | Toyota et al. | |
| 8,130,333 B2 | 3/2012 | Egami | |
| 8,168,982 B2 | 5/2012 | Ishii | |
| 2008/0265254 A1 | 10/2008 | Nishiura | |
| 2010/0012979 A1 * | 1/2010 | Ishii | .............................. 257/203 |

FOREIGN PATENT DOCUMENTS

| | | | |
|---|---|---|---|
| JP | 2000-267131 A | | 9/2000 |
| JP | 2003-330036 A | | 11/2003 |
| JP | 2005-283824 A | | 10/2005 |
| JP | 2008-26719 A | | 2/2008 |
| JP | 2008-275937 A | | 11/2008 |
| JP | 2009-109930 A | | 5/2009 |
| JP | 2010-91740 A | | 4/2010 |
| JP | 2010091740 A | * | 4/2010 |
| JP | 2011-186108 A | | 9/2011 |

* cited by examiner

*Primary Examiner* — Bac Au
*Assistant Examiner* — Sophia Nguyen
(74) *Attorney, Agent, or Firm* — ALG Intellectual Property, LLC

(57) ABSTRACT

A capacitance element includes a first capacitance electrode formed over a TFT with a insulating interlayer therebetween, and a second capacitance electrode formed so as to oppose the first capacitance electrode with a first dielectric layer therebetween, the second capacitance electrode being electrically connected to a semiconductor layer of the TFT through a contact hole formed in the insulating interlayer. The second capacitance electrode includes a first conductive layer and a second conductive layer stacked on the first conductive layer. A portion of the first conductive layer overlapping the contact hole is removed, and the second conductive layer and the semiconductor layer are electrically connected to each other through the contact hole.

3 Claims, 12 Drawing Sheets

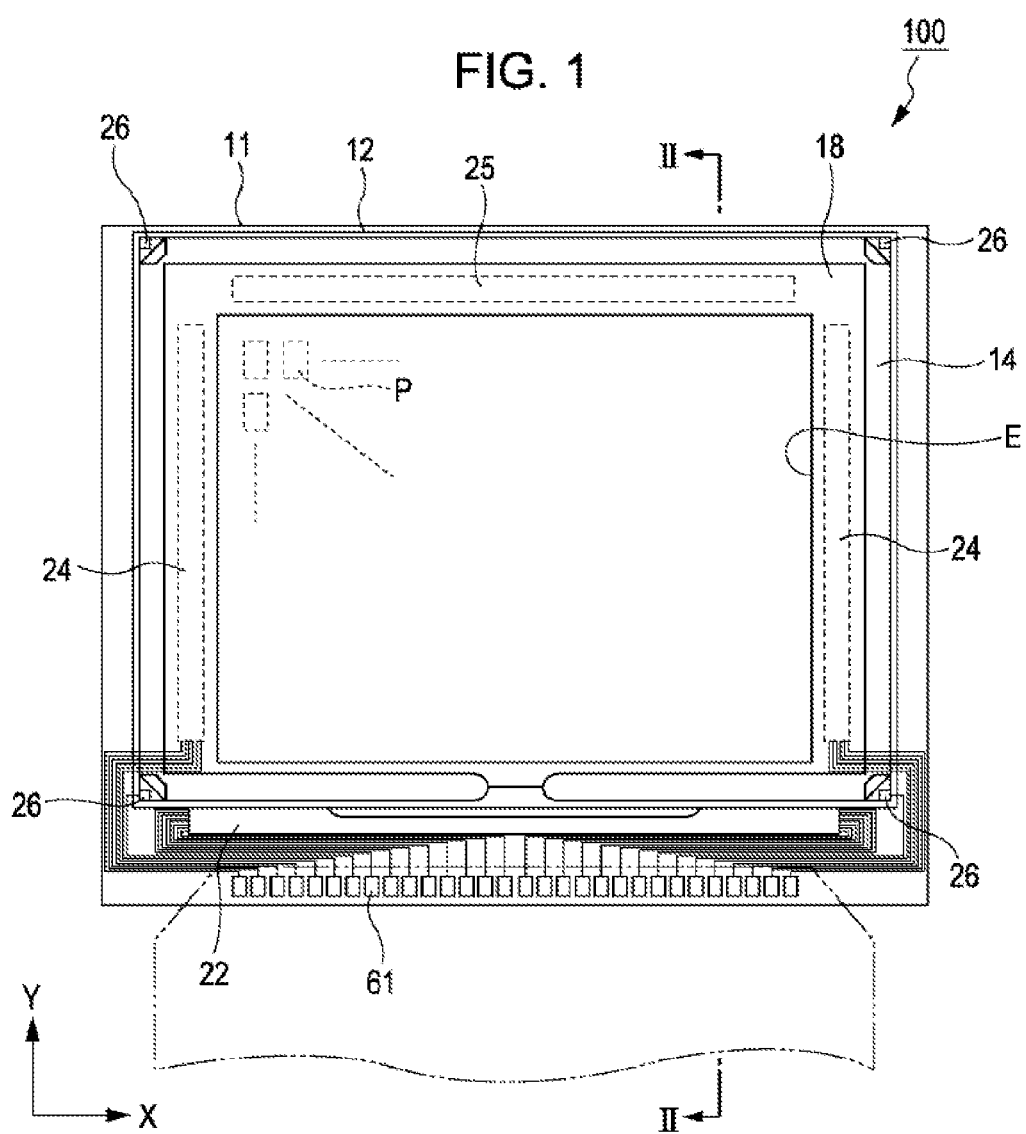
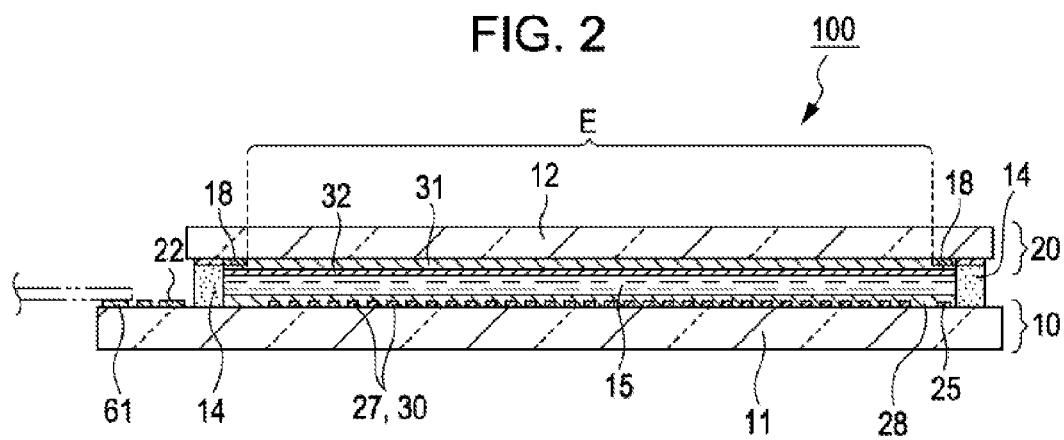

CONTACT RESISTANCE

LIFE SPAN OF LIQUID CRYSTAL DEVICE

ELECTRO-OPTICAL APPARATUS AND ELECTRONIC APPARATUS

BACKGROUND

1. Technical Field

The present invention relates to an electro-optical apparatus and an electronic apparatus.

2. Related Art

The electro-optical apparatuses thus far developed include an actively driven liquid crystal device that includes transistors that each serve as a switching element of a pixel electrode, provided for each pixel. The thus-configured liquid crystal device includes capacitance elements that temporarily retain a potential of each of the pixel electrodes on the basis of image signals provided, for example as disclosed in JP-A-2008-26719.

To manufacture the liquid crystal device, in particular the one including the capacitance element, for example, a semiconductor layer for constituting the transistor is first formed on a substrate. Then a lower electrode layer that constitutes the capacitance element is deposited, and a dielectric layer is deposited thereon. A contact hole is then formed so as to penetrate through the dielectric layer and the lower electrode layer for connection to the semiconductor layer, and upon forming an upper electrode layer so as to fill in the contact hole, the capacitance element electrically connected to the semiconductor layer can be obtained.

However, a natural oxide layer may be formed on a portion of the semiconductor layer exposed when the contact hole is formed. In this case, the natural oxide layer acts as resistance that impedes the conduction, after the contact hole is filled with the upper electrode layer so as to achieve the electrical connection.

As a remedy therefor, the exposed portion of the dielectric layer and the contact hole are subjected to a diluted hydrogen fluoride (DHF) treatment after the formation of the contact hole, to thereby remove the natural oxide layer formed on the semiconductor layer. Then upon forming the upper electrode layer which serves as the capacitance element, the electrical connection between the semiconductor layer and the capacitance element can be secured.

With the foregoing remedy, however, since the exposed portion of the dielectric layer is also subjected to the DHF treatment, the dielectric layer constituting a part of the capacitance element suffers a decline in withstand voltage.

In addition, it has been discovered by the present inventors that the aforementioned factors shorten the life span of the electro-optical apparatus. The foregoing technique has, therefore, a drawback in that the quality of displayed images may be degraded.

SUMMARY

The invention may be advantageously realized as the following application examples and embodiments.

APPLICATION EXAMPLE 1

A first application example of the invention represents an electro-optical apparatus that includes a transistor, and a capacitance element electrically connected to the transistor. The capacitance element includes a first capacitance electrode formed over the transistor with an interlayer dielectric layer therebetween, and a second capacitance electrode formed so as to oppose the first capacitance electrode with a first capacitance insulation layer therebetween, the second capacitance electrode being electrically connected to a semiconductor layer of the transistor through a contact hole formed in the interlayer dielectric layer, the second capacitance electrode includes a first conductive layer and a second conductive layer stacked on the first conductive layer, a portion of the first conductive layer overlapping the contact hole is removed, and the second conductive layer and the semiconductor layer of the transistor are electrically connected to each other through the contact hole.

In the thus-configured electro-optical apparatus, the second capacitance electrode includes the two conductive layers, and the contact hole and the second conductive layer are formed with the first capacitance insulation layer being covered with the first conductive layer. Accordingly, even when, for example, a natural oxide layer is formed on a portion of the semiconductor layer exposed inside the contact hole after the contact hole is formed and then a DHF treatment is performed so as to remove the natural oxide layer, the first capacitance insulation layer can be prevented from being exposed to the hydrogen fluoride because the first capacitance insulation layer is covered with the first conductive layer, and therefore the natural oxide layer can be removed without compromising the withstand voltage of the first capacitance insulation layer. Further, the second conductive layer formed on the first conductive layer and inside the contact hole allows the capacitance element and the semiconductor layer to be electrically connected to each other.

APPLICATION EXAMPLE 2

Preferably, the electro-optical apparatus according to the application example 1 may further include a first insulation layer formed so as to cover an end portion of the first capacitance electrode.

The first insulation layer provided as above prevents an electrical short circuit at an end face of the first capacitance electrode and that of the second capacitance electrode. The first insulation layer also serves to mitigate damage that the first capacitance electrode may suffer in an etching process, for example dry etching, to form the contact hole. In addition, the first insulation layer can serve as an etching stopper in an etching process, for example dry etching, to form the second capacitance electrode.

APPLICATION EXAMPLE 3

Preferably, the electro-optical apparatus according to the foregoing application examples may further include a second capacitance insulation layer formed on the second capacitance electrode on the side thereof opposite the first capacitance insulation layer, and a third capacitance electrode disposed so as to oppose the second capacitance electrode with the second capacitance insulation layer therebetween.

With such a configuration, the second capacitance electrode and the third capacitance electrode opposing each other with the second capacitance insulation layer therebetween can serve as a capacitance element. In this case, a pair of capacitance elements can be obtained, one composed of the first capacitance electrode and the second capacitance electrode and the other composed of the second capacitance electrode and the third capacitance electrode, in other words, a pair of capacitance elements connected in parallel can be obtained, which leads to an increase in capacitance value per unit area.

APPLICATION EXAMPLE 4

Preferably, the electro-optical apparatus according to the foregoing application examples may further include a second insulation layer formed so as to cover an end portion of the second capacitance electrode.

The second insulation layer provided as above prevents an electrical short circuit at an end face of the second capacitance electrode and that of the third capacitance electrode. In addition, the second insulation layer can serve as an etching stopper in an etching process, for example dry etching, to form the third capacitance electrode.

APPLICATION EXAMPLE 5

A fifth application example represents a method of manufacturing an electro-optical apparatus, including forming a transistor, forming an interlayer dielectric layer so as to cover the transistor, forming a first capacitance electrode on the interlayer dielectric layer, forming a first conductive layer on the first capacitance electrode with a first capacitance insulation layer therebetween, so as to constitute a second capacitance electrode, forming a contact hole penetrating through the first conductive layer, the first capacitance insulation layer, the first capacitance electrode, and the interlayer dielectric layer so as to reach a semiconductor layer of the transistor, applying a chemical solution containing hydrogen fluoride to the semiconductor layer of the transistor exposed in the contact hole, and forming a second conductive layer in contact with the semiconductor layer of the transistor so as to constitute the second capacitance electrode, on the first conductive layer constituting the second capacitance electrode and inside the contact hole.

With the method thus arranged, even when a natural oxide layer is formed on a portion of the semiconductor layer exposed inside the contact hole after the contact hole is formed and then the chemical solution containing hydrogen fluoride is applied to remove the natural oxide layer, the first capacitance insulation layer can be prevented from being exposed to the hydrogen fluoride because the first capacitance insulation layer is covered with the first conductive layer, and therefore the natural oxide layer can be removed without compromising the withstand voltage of the first capacitance insulation layer. Further, the second conductive layer formed on the first conductive layer and inside the contact hole allows the capacitance element and the semiconductor layer to be electrically connected to each other.

APPLICATION EXAMPLE 6

Preferably, the method according to the application example 5 may further include forming a second capacitance insulation layer on the second capacitance electrode, and forming a third capacitance electrode on the second capacitance insulation layer.

With the method thus arranged, since the third capacitance electrode is formed on the second capacitance insulation layer, another capacitance element composed of the second capacitance electrode and the third capacitance electrode can be obtained. Accordingly, a pair of capacitance elements can be obtained, one composed of the first capacitance electrode and the second capacitance electrode and the other composed of the second capacitance electrode and the third capacitance electrode, in other words, a pair of capacitance elements connected in parallel can be obtained, which leads to an increase in capacitance value per unit area.

APPLICATION EXAMPLE 7

A seventh application example represents an electronic apparatus that includes the foregoing electro-optical apparatus.

The electronic apparatus allows, because of including the foregoing electro-optical apparatus, the potential of each pixel electrode to be securely retained, thereby improving the display quality.

BRIEF DESCRIPTION OF THE DRAWINGS

The invention will be described with reference to the accompanying drawings, wherein like numbers reference like elements.

FIG. 1 is a schematic plan view showing a liquid crystal device exemplifying the electro-optical apparatus.

FIG. 2 is a schematic cross-sectional view taken along a line II-II in FIG. 1.

DESCRIPTION OF EXEMPLARY EMBODIMENTS

Figure 3:
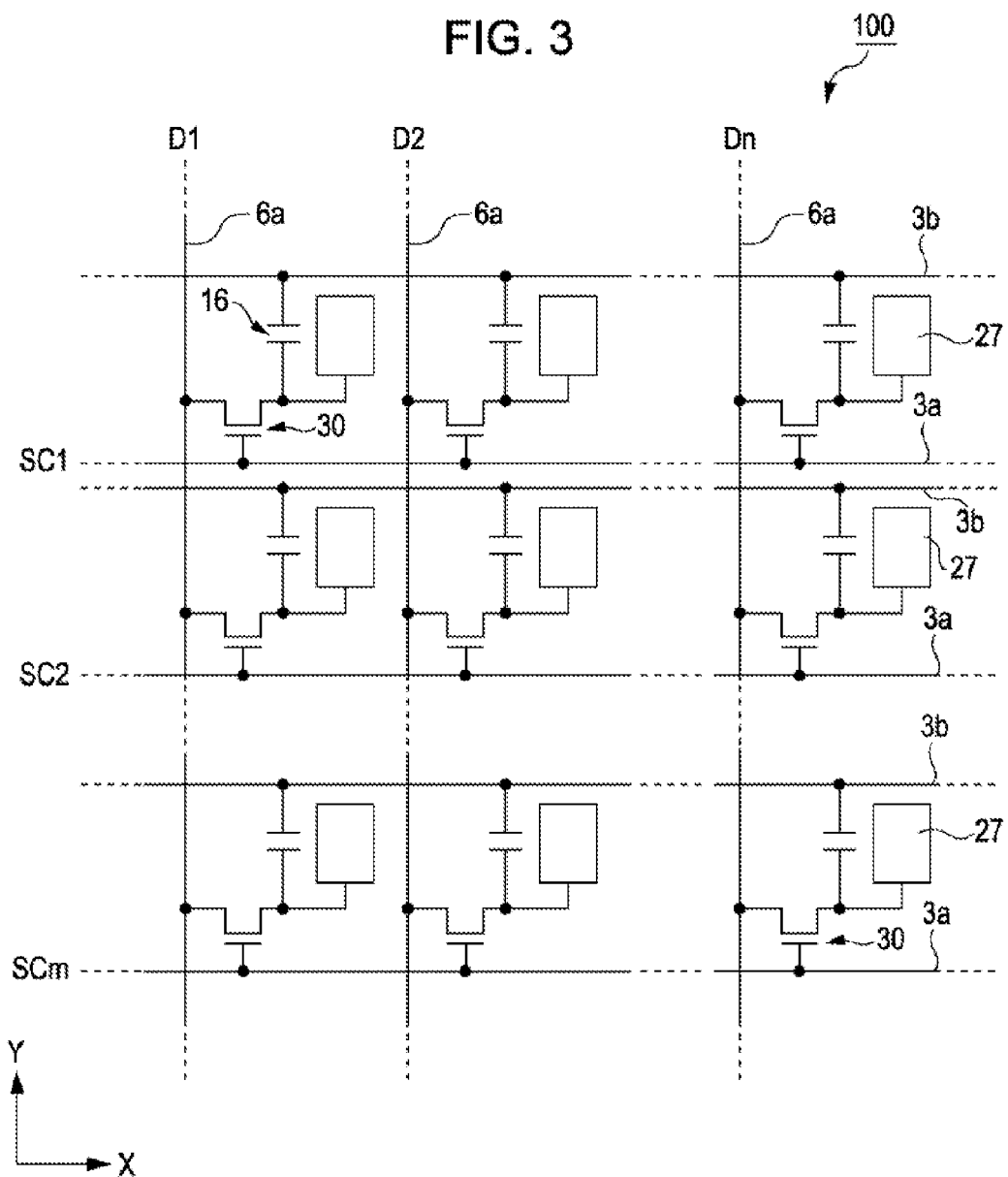
FIG. 3 is an equivalent circuit diagram representing an electrical configuration of the liquid crystal device.

Hereafter, an embodiment of the invention will be described referring to the drawings. In the drawings, the constituents may be illustrated in scales different from the actual ones, for the sake of better visual understanding.

In the following description, an expression "on the substrate" for example, will encompass the cases where a constituent is provided on the substrate in contact therewith, where the constituent is provided on the substrate with another constituent interposed therebetween, and where a part of the constituent is disposed in contact with the substrate and another part of the constituent is provided on the substrate with another constituent interposed therebetween.

In this embodiment, an electro-optical apparatus will be described with reference to an actively driven liquid crystal device that includes thin film transistors (hereinafter, TFT) that each serve as a switching element of each pixel, as an example. The liquid crystal device may be suitably employed, for example, as an optical modulation element (liquid crystal light bulb) of a liquid crystal projector.

Configuration of Electro-Optical Apparatus

FIG. 1 is a schematic plan view showing the liquid crystal device exemplifying the electro-optical apparatus. FIG. 2 is a schematic cross-sectional view taken along a line II-II in FIG. 1. FIG. 3 is an equivalent circuit diagram representing an electrical configuration of the liquid crystal device. Referring to FIGS. 1 to 3, the configuration of the liquid crystal device will be described hereunder.

As shown in FIGS. 1 and 2, the liquid crystal device 100 according to this embodiment includes a pair of substrates, namely an element substrate 10 and a counter substrate 20 disposed so as to oppose each other, and a liquid crystal layer 15 interposed between the pair of substrates. A first substrate 11 constituting the element substrate 10 and a second substrate 12 constituting the counter substrate 20 are formed of a transparent material such as glass or quartz, or silicon.

The element substrate 10 is larger than the counter substrate 20 both in length and width, and these substrates are joined together via a seal member 14 arranged in a frame shape, with liquid crystal having positive or negative dielectric anisotropy enclosed therebetween so as to constitute a liquid crystal layer 15. The seal member 14 may be, for example, an adhesive composed of a thermosetting or UV-curable epoxy resin. The seal member 14 may contain a spacer (not shown) for maintaining the gap between the pair of substrates constant.

A light shield layer 18, also having a frame shape, is provided inside the frame-shaped seal member 14 on the side of the counter substrate 20. The light shield layer 18, for example formed of a light-shielding metal or an oxide thereof, defines thereinside a display region E containing a plurality of pixels P. Although not shown in FIG. 1, light shield materials are also disposed in the display region E so as to divide each of the pixels P in a plan view.

A data line driver circuit 22 is provided between a side of the first substrate 11 and a portion of the seal member 14 disposed along that side. An inspection circuit 25 is provided inside a portion of the seal member 14 disposed along a side of the first substrate 11 opposite the first mentioned side thereof. Further, scanning line driver circuits 24 are each provided inside a portion of the seal member 14 disposed along a respective side of the first substrate 11 orthogonal to the first mentioned side and opposing each other. A plurality of interconnects (not shown) are provided inside the portion of the seal member 14 disposed along the side of the first substrate 11 opposite the first mentioned side, so as to connect the two scanning line driver circuits 24.

The data line driver circuit 22 and the interconnects connecting the scanning line driver circuits 24 are connected to a plurality of external connection terminals 61 aligned along the first mentioned side. Hereafter, the direction along the first mentioned side will be defined as X-direction, and the direction along the two sides orthogonal to the first mentioned side and opposing each other will be defined as Y-direction. Here, the inspection circuit 25 may be located inside a portion of the seal member 14 disposed between the data line driver circuit 22 and the display region E.

As shown in FIG. 2, TFTs 30 each serving as a light-transmissive pixel electrode 27 and a switching element for each pixel, a signal interconnect, and an alignment layer 28 covering the TFTs 30 and the signal interconnect are provided on the surface of the first substrate 11 opposing the liquid crystal layer 15. In addition, a light shielding structure is adopted in order to prevent intrusion of light into the semiconductor layer of the TFT 30 that may disturb the switching operation.

On the surface of the second substrate 12 opposing the liquid crystal layer 15, the light shield layer 18, an interlayer dielectric layer (not shown) formed so as to cover the light shield layer 18, a common electrode 31 formed so as to cover the interlayer dielectric layer, and an alignment layer 32 covering the common electrode 31 are provided.

The light shield layer 18 is formed in a frame shape at a position overlapping the scanning line driver circuits 24 and the inspection circuit 25 in a plan view, as shown in FIG. 1. The light shield layer 18 serves to block light incident thereon from the side of the counter substrate 20, to thereby prevent malfunction of the driver circuits and peripheral circuits due to intrusion of light. In addition, the light shield layer 18 inhibits unnecessary stray light from being incident into the display region E, thus to secure a high contrast of images displayed in the display region E.

The interlayer dielectric layer is formed of an inorganic material such as silicon oxide, and covers the light shield layer 18 so as to transmit light. The interlayer dielectric layer may be formed, for example, through a plasma chemical vapor deposition (CVD) process.

The common electrode 31 is formed of a transparent conductive layer such as indium tin oxide (ITO), and disposed so as to cover the interlayer dielectric layer. In addition, the common electrode 31 is electrically connected to the interconnect on the side of the element substrate 10, through vertical connectors 26 provided at the respective corners of the counter substrate 20 as shown in FIG. 1.

The alignment layer 28 covering the pixel electrode 27 and the alignment layer 32 covering the common electrode 31 are selected on the basis of the optical design of the liquid crystal device 100. For example, an inorganic material such as silicon oxide (SiOx) may be deposited through a vapor deposition process, such that the liquid crystal molecules are generally vertically aligned.

As shown in FIG. 3, the liquid crystal device 100 includes a plurality of scanning lines 3a and a plurality of data lines 6a insulated from each other at least in the display region E and arranged orthogonal to each other, and capacitance lines 3b. The direction in which the scanning lines 3a extend corresponds to the X-direction, and the direction in which the data lines 6a extend corresponds to the Y-direction.

The pixel electrode 27, the TFT 30, and a capacitance element 16 are provided in a region defined by the scanning line 3a, the data line 6a, the capacitance line 3b, and signal lines thereof, so as to constitute a pixel circuit of each of the pixels P.

The scanning line 3a is electrically connected directly to the gate of the TFT 30, and the data line 6a is electrically connected to the data line-side source/drain region of the TFT 30. The pixel electrode 27 is electrically connected to the pixel electrode-side source/drain region of the TFT 30.

The data line 6a is connected to the data line driver circuit 22 (see FIG. 1), and provides image signals D1, D2, . . . , Dn from the data line driver circuit 22 to the pixels P. The scanning line 3a is connected to the scanning line driver circuit 24 (see FIG. 1), and provides scanning signals SC1, SC2, . . . , SCm from the scanning line driver circuit 24 to each of the pixels P.

The image signals D1 to Dn may be line-sequentially provided from the data line driver circuit 22 to the data line 6a in this sequence, or may be provided to each group including a plurality of data lines 6a adjacent to each other. The scanning line driver circuit 24 line-sequentially provides the scanning signals SC1 to SCm to the scanning line 3a in a form of pulses at predetermined intervals.

In the liquid crystal device 100, the image signals D1 to Dn provided from the data line 6a are written in the pixel electrode 27 at a predetermined timing, when the TFT 30 serving as the switching element is turned on for a predetermined period upon receipt of the scanning signals SC1 to SCm. The image signals D1 to Dn of a predetermined level written in the liquid crystal layer 15 through the pixel electrode 27 are retained for a predetermined period, between the pixel electrode 27 and the common electrode 31 located opposite the pixel electrode 27 with the liquid crystal layer 15 therebetween.

The retention capacitance 16 is connected in parallel to the liquid crystal capacitance formed between the pixel electrode 27 and the common electrode 31, so as to suppress leakage of the retained image signals D1 to Dn. The capacitance element 16 is provided between the pixel electrode-side source/drain region of the TFT 30 and the capacitance line 3b. The capacitance element 16 includes a dielectric layer located between the two capacitance electrodes.

For the thus-configured liquid crystal device 100, various optical designs may be adopted such as a transmissive type set in a normally white mode in which a white display is shown when the pixels P are not driven, or in a normally black mode in which a dark display is shown when the pixels P are not driven. Polarizers are disposed on the incident side and output side, in accordance with the optical design of the liquid crystal device 100.

Figure 6:
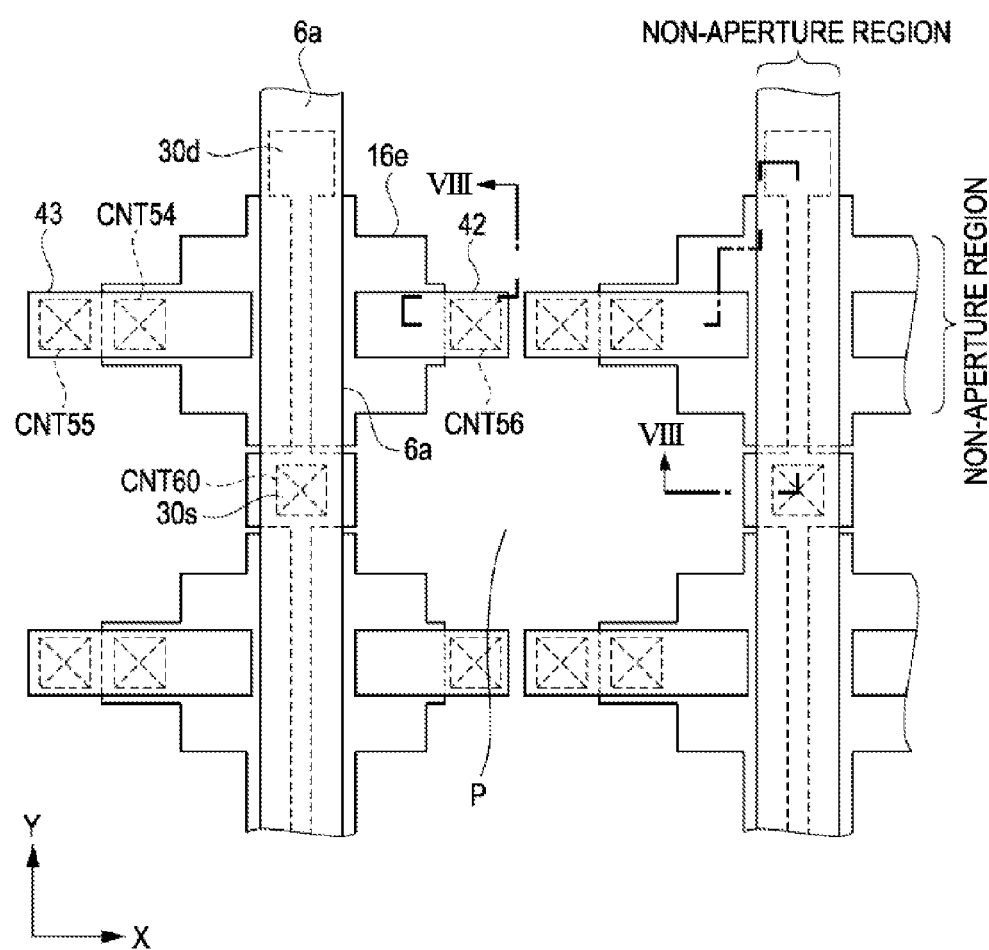
FIG. 6 is still another schematic plan view showing a configuration of the pixel in the liquid crystal device.
Figure 7:
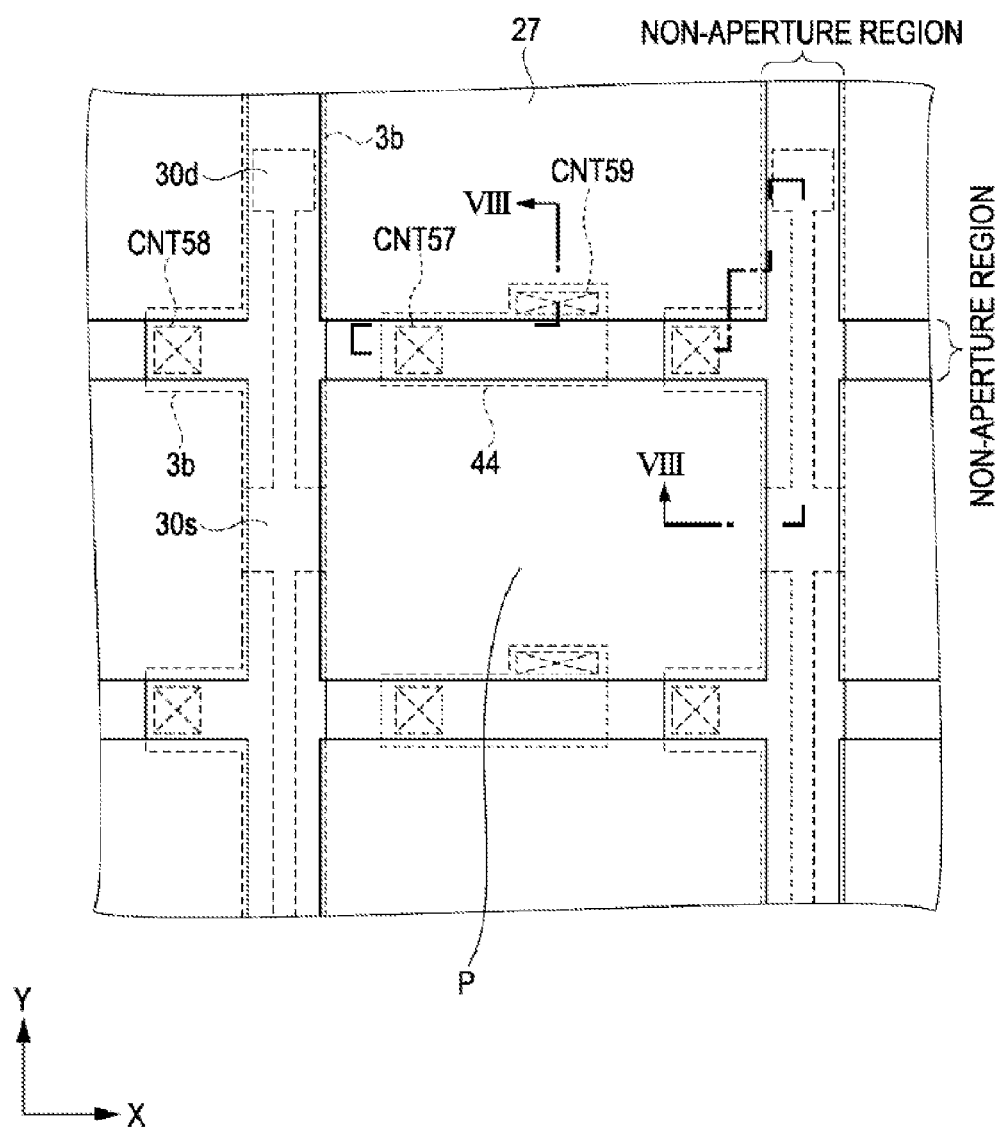
FIG. 7 is still another schematic plan view showing a configuration of the pixel in the liquid crystal device.
Figure 8:
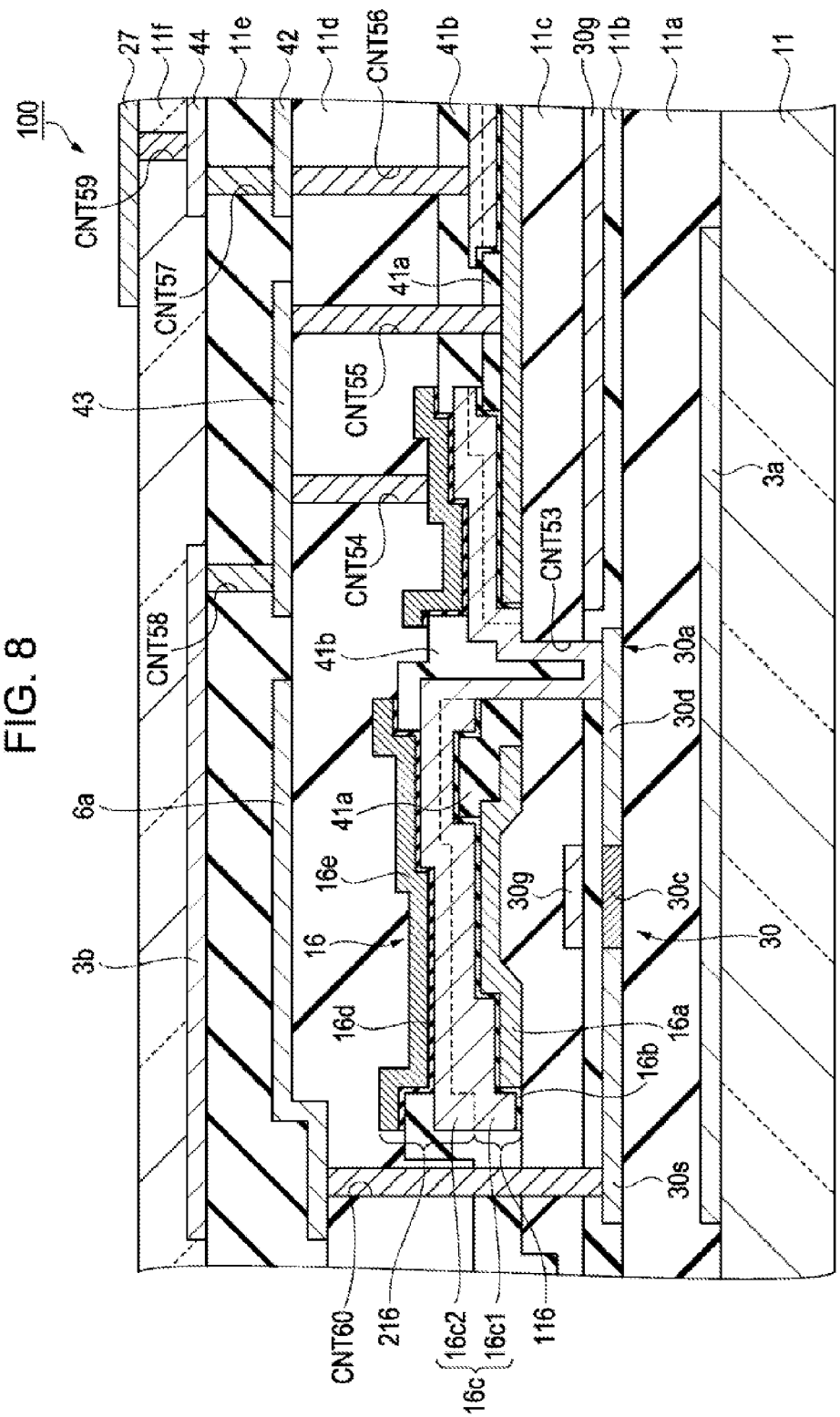
FIG. 8 is a schematic cross-sectional view taken along lines VIII-VIII in FIGS. 4 to 7.

FIGS. 4 to 7 are schematic plan views showing the configuration of the pixel of the liquid crystal device. FIG. 8 is a schematic cross-sectional view of the pixel shown in FIGS. 4 to 7. Referring now to FIGS. 4 to 8, the configuration of the pixel will be described on the basis of the plan views and the cross-sectional view.

Figure 4:
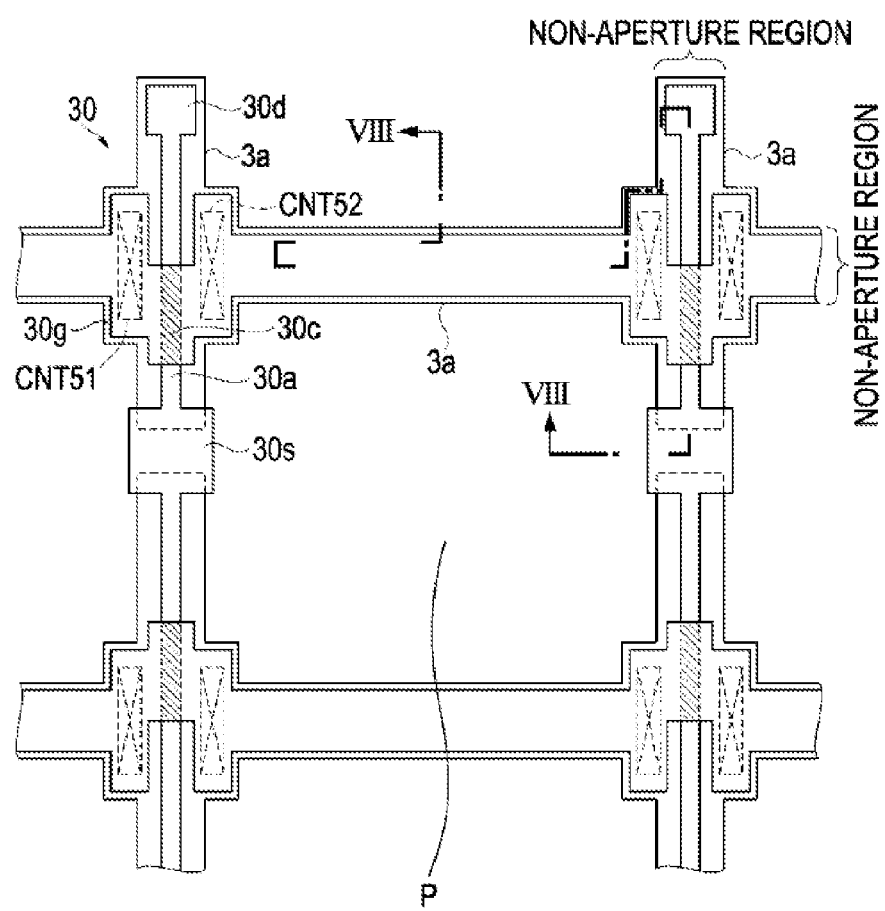
FIG. 4 is a schematic plan view showing a configuration of a pixel in the liquid crystal device.
Figure 5:
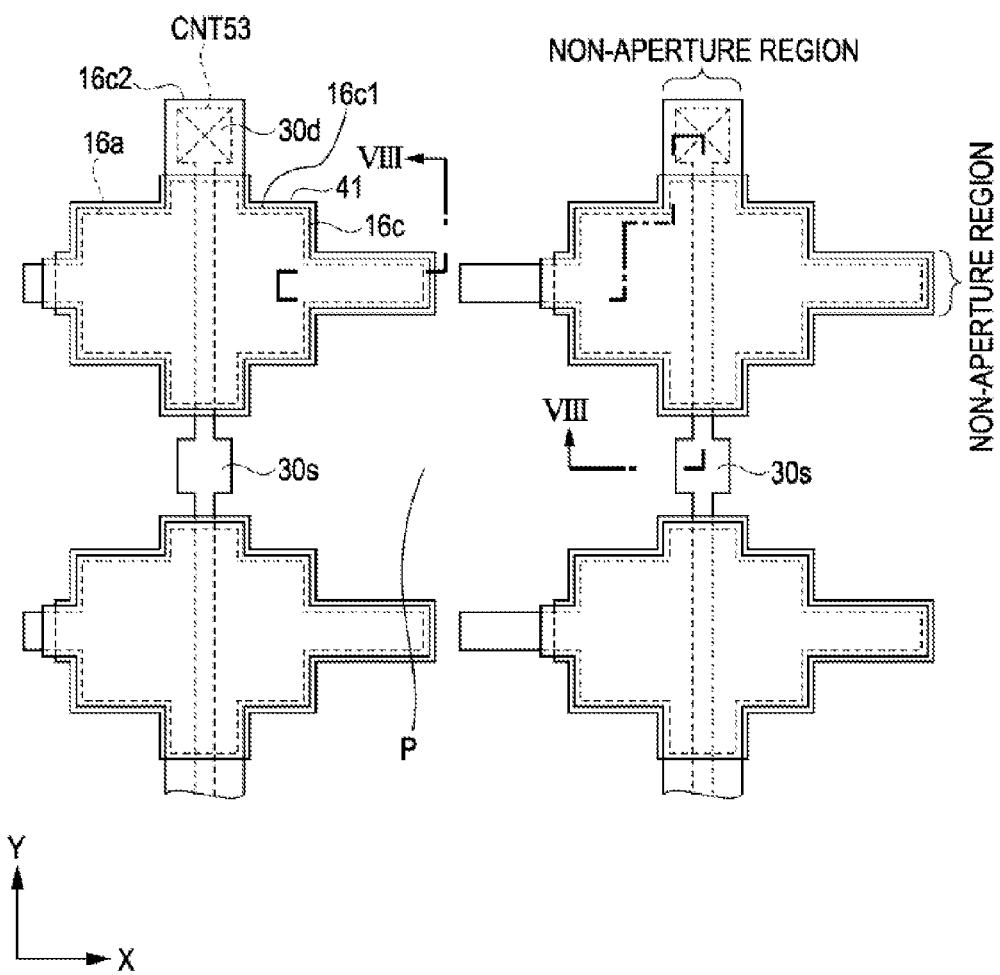
FIG. 5 is another schematic plan view showing a configuration of the pixel in the liquid crystal device.

Here, FIG. 4 is a schematic plan view showing layers from a light shield layer to a gate electrode of the pixel P. FIG. 5 is a schematic plan view showing layers from a first capacitance electrode to a second capacitance electrode. FIG. 6 is a schematic plan view showing layers from a third capacitance electrode to a data line. FIG. 7 is a schematic plan view showing layers from a capacitance line to a pixel electrode.

Referring first to FIG. 4, the scanning line 3a exemplifying the light shield layer is provided in a non-aperture region extending in the X-direction. The scanning line 3a is formed of a light-shielding conductive material, and constitutes at least a part of the non-aperture region. Examples of the light-shielding conductive material include W, Ti, and TiN.

The TFT 30 shown in FIG. 3 is provided in a non-aperture region extending in the Y-direction. Locating the TFT 30 in the non-aperture region which shields light prevents optical malfunction of the TFT 30 and allows a sufficient aperture to be secured in an aperture region.

More specifically, the TFT 30 includes a semiconductor layer 30a including a data line-side source/drain region 30s, a pixel electrode-side source/drain region 30d, and a channel region 30c as shown in FIG. 4. As stated above, the semiconductor layer 30a is located in the non-aperture region extending in the Y-direction.

Further, the TFT 30 includes a gate electrode 30g formed along the scanning line 3a in the non-aperture region. The gate electrode 30g is disposed such that a portion thereof extending in the X-direction overlaps the channel region 30c in a plan view. In addition, the gate electrode 30g is electrically connected to the scanning line 3a through contact holes CNT51, CNT52 respectively located between a portion of the gate electrode 30g extending in the X-direction and the scanning line 3a. Here, the gate electrode 30g also serves as a scanning line like the scanning line 3a provided under the TFT 30 so as to serve as the light shield layer, and may therefore be called a second scanning line.

Since the scanning line 3a is located in a lower layer than the semiconductor layer 30a, forming the scanning line 3a in a wider width than the semiconductor layer 30a of the TFT 30 allows the majority or entirety of the channel region 30c of the TFT 30 to be protected from the light from the liquid crystal projector. Such a configuration minimizes photoelectric leak current in the TFT 30 during the operation of the liquid crystal device 100, thereby improving the contrast ratio and thus achieving a high-quality display. Here, the generally rectangular aperture region defined by the non-aperture region corresponds to the region of the pixel P.

Proceeding to FIG. 5, on the gate electrode 30g inn the non-aperture region, an island-shape first capacitance electrode 16a, a first dielectric layer 16b exemplifying the first capacitance insulation layer, and a second capacitance electrode 16c are stacked in this order from the side of the first substrate 11.

The second capacitance electrode 16c is composed of two layers, namely a first conductive layer 16c1 and a second conductive layer 16c2, stacked in this order from the side of the first substrate 11. Of the second capacitance electrode 16c, the second conductive layer 16c2 is disposed so as to extend to a region overlapping the pixel electrode-side source/drain region 30d of the semiconductor layer 30a in a plan view. More specifically, the second conductive layer 16c2 and the pixel electrode-side source/drain region 30d are electrically connected to each other through the contact hole CNT53.

In addition, a first insulation layer 41a that serves as an etching stopper in the formation process of the second capacitance electrode 16c is provided in a region overlapping a part of the outer periphery of the second capacitance electrode 16c in a plan view.

Proceeding to FIG. 6, on the second capacitance electrode 16c, a second dielectric layer 16d exemplifying the second capacitance insulation layer, and a third capacitance electrode 16e are stacked in this order from the side of the first substrate 11. The third capacitance electrode 16e is disposed so as to generally overlap the first capacitance electrode 16a in a plan view.

In addition, a first relay electrode 42 and a third relay electrode 43, both having an island shape, are disposed along the X-direction in the non-aperture region. The third relay electrode 43 is electrically connected to the third capacitance electrode 16e through a contact hole CNT54 located between a portion of the third relay electrode 43 extending in the X-direction and the third capacitance electrode 16e.

Further, the data line 6a is provided in the non-aperture region extending in the Y-direction. The data line 6a is electrically connected to the data line-side source/drain region 30s through a contact hole CNT60 located between a portion of the data line 6a extending in the Y-direction and the data line-side source/drain region 30s. The data line 6a is formed of a light-shielding conductive material, and constitutes at least a part of the non-aperture region.

Proceeding to FIG. 7, the capacitance line 3b, a second relay electrode 44, and the pixel electrode 27 are provided on the data line 6a. The second relay electrode 44 is electrically connected to the first relay electrode 42 through a contact hole CNT57 located between a portion of the second relay electrode 44 extending in the X-direction and the first relay electrode 42.

The capacitance line 3b is disposed along the data line 6a. The capacitance line 3b is electrically connected to the third relay electrode 43 through a contact hole CNT58 located between a portion of the capacitance line 3b extending in the X-direction and the third relay electrode 43.

The pixel electrode 27 is formed in an island shape so as to be associated with each of the pixels P, and disposed such that the outer periphery of the pixel electrode 27 overlaps the scanning line 3a and the data line 6a in a plan view. The pixels P are divided into individual ones in a matrix pattern by the data line 6a and the scanning line 3a, such that the end portion of each pixel P partially overlaps the data line 6a and the scanning line 3a.

Referring now to FIG. 8, the configuration of the pixel P will be described in further details. As shown in FIG. 8, the scanning line 3a is provided on the first substrate 11. The scanning line 3a has a light-shielding property and may be formed of a solid metal, an alloy, a metal silicide, a polysilicide, or a nitride composed at least one of Al, Ti, Cr, W, Ta, and Mo, or a layered structure thereof.

An underlying insulation layer 11a, formed of silicon oxide for example, is provided on the scanning line 3a so as to cover the first substrate 11 and the scanning line 3a. Further, the semiconductor layer 30a of the island shape is provided on the underlying insulation layer 11a.

The semiconductor layer 30a is formed of, for example, a polycrystalline silicon layer, onto which an impurity ion is implanted so as to form the data line-side source/drain region 30s, the channel region 30c, and the pixel electrode-side source/drain region 30d.

A first interlayer dielectric layer (gate insulation layer) 11b is provided on the semiconductor layer 30a so as to cover the semiconductor layer 30a and the underlying insulation layer 11a. Further, the gate electrode 30g is provided so as to oppose the channel region 30c with the first interlayer dielectric layer 11b therebetween.

A second interlayer dielectric layer 11c is provided on the gate electrode 30g so as to cover the gate electrode 30g and the first interlayer dielectric layer 11b.

The capacitance element 16 is provided on the second interlayer dielectric layer 11c, and more particularly a first capacitance element 116 and a second capacitance element 216, constituting a part of the capacitance element 16, are stacked on the second interlayer dielectric layer 11c. In other words, the capacitance element 16 includes a pair of capacitance elements 116, 216 connected in parallel.

To be more detailed, the first capacitance electrode 16a constituting the first capacitance element 116 is patterned on the second interlayer dielectric layer 11c. The first capacitance electrode 16a is connected to a constant potential. The first capacitance electrode 16a is formed of a non-transparent metal layer or polysilicon layer containing a metal such as Al or Ag or an alloy thereof, and serves also as the light shield layer that blocks light incident on the TFT 30.

The first dielectric layer 16b has a monolayer or a multilayer structure composed of a silicon oxide ($SiO_2$) layer such as a high temperature oxide (HTO) layer or a low temperature oxide (LTO) layer, or a silicon nitride (SiN) layer. The second capacitance electrode 16c is patterned on the first dielectric layer 16b.

The second capacitance electrode 16c is a pixel electrode-side capacitance electrode electrically connected to the pixel electrode-side source/drain region 30d of the TFT 30 and the pixel electrode 27. More specifically, the second capacitance electrode 16c is composed of two polysilicon layers or two metal layers, and includes a first conductive layer 16c1 formed by patterning on the side of the TFT 30 and a second conductive layer 16c2 formed by patterning on the side of the pixel electrode 27.

Further, the second conductive layer 16c2 on the side of the pixel electrode 27 is electrically connected to the pixel electrode-side source/drain region 30d through the contact hole CNT53, and to the first relay electrode 42 through the contact hole CNT56. The first relay electrode 42 is electrically connected to the second relay electrode 44 through the contact hole CNT57. The second relay electrode 44 is electrically connected to the pixel electrode 27 through the contact hole CNT59.

Thus, the second conductive layer 16c2 constituting a part of the second capacitance electrode 16c serves to relay the electrical connection between the pixel electrode-side source/drain region 30d and the pixel electrode 27, in collaboration with the first relay electrode 42 and the second relay electrode 44. The first capacitance electrode 16a, the first dielectric layer 16b, and the first conductive layer 16c1 constitute a first capacitance element 116.

The first insulation layer 41a is disposed so as to cover the end portion of the first capacitance electrode 16a, and the second insulation layer 41b is disposed so as to cover the end portion of the second capacitance electrode 16c. The first insulation layer 41a serves to prevent an electrical short circuit at the end face of the first capacitance electrode 16a and that of the second capacitance electrode 16c, and to mitigate damage that the first capacitance electrode 16a may suffer in an etching process, for example dry etching, to form the contact hole CNT53. In addition, the first insulation layer 41a can serve as an etching stopper in an etching process, for example dry etching, to form the second capacitance electrode 16c. The second insulation layer 41b serves to prevent an electrical short circuit at the end face of the second capacitance electrode 16c and that of the third capacitance electrode 16e, and also serves as an etching stopper in an etching process, for example dry etching, to form the third capacitance electrode 16e.

The second dielectric layer 16d constituting a part of a second capacitance element 216 is provided on the second capacitance electrode 16c. The second dielectric layer 16d has the same structure as that of the first dielectric layer 16b, i.e., has a monolayer or a multilayer structure composed of a silicon oxide ($SiO_2$) layer such as a high temperature oxide (HTO) layer or a low temperature oxide (LTO) layer, or a silicon nitride (SiN) layer.

The third capacitance electrode 16e constituting a part of the second capacitance element 216 is patterned on the second dielectric layer 16d. The third capacitance electrode 16e has the same structure as that of the first capacitance electrode 16a, and is connected to a fixed potential. The third capacitance electrode 16e is formed of a non-transparent metal layer containing a metal such as W, Al, or Ag, or an alloy such as WSi.

The thus-configured capacitance element 16 contributes to improving potential retention characteristics of the pixel electrode 27, as well as display characteristics such as contrast ratio and suppression of flickering. The second conductive layer 16c2, the second dielectric layer 16d, and the third capacitance electrode 16e constitute the second capacitance element 216. In other words, a pair of capacitance elements 116, 216 are provided in parallel.

Providing thus the capacitance elements 116, 216 in parallel leads to increased capacitance value of the capacitance element 16. In addition, the first capacitance element 116 and the second capacitance element 216 are disposed so as to overlap in a plan view. Such a configuration contributes to increasing the capacitance value per unit area.

A third interlayer dielectric layer 11d is provided on the capacitance element 16, with the second insulation layer 41b therebetween. The data line 6a, the first relay electrode 42, and the third relay electrode 43 are patterned on the third interlayer dielectric layer 11d.

The data line 6a is electrically connected to the data line-side source/drain region 30s of the semiconductor layer 30a, through the contact hole CNT60 penetrating through the layers from the third interlayer dielectric layer 11d to the first interlayer dielectric layer 11b. The data line 6a, the first relay electrode 42, and the third relay electrode 43 are formed of a conductive material such as a metal layer.

The first relay electrode 42 is electrically connected to the second capacitance electrode 16c through the contact hole CNT56 penetrating through the third interlayer dielectric layer 11d and the second insulation layer 41b.

The third relay electrode 43 is electrically connected to the third capacitance electrode 16e through the contact hole CNT54 penetrating through the third interlayer dielectric layer 11d. The third relay electrode 43 is also electrically connected to the first capacitance electrode 16a through the contact hole CNT55 penetrating through the third interlayer dielectric layer 11d and the second insulation layer 41b.

A fourth interlayer dielectric layer 11e is provided on the data line 6a, the third relay electrode 43, and the first relay electrode 42, with the third interlayer dielectric layer 11d therebetween. The capacitance line 3b and the second relay electrode 44 are patterned on the fourth interlayer dielectric layer 11e.

The capacitance line 3b contains a metal such as aluminum, and a constant potential (LCCOM) is supplied thereto. The capacitance line 3b is electrically connected to the third relay electrode 43 through the contact hole CNT58 penetrating through the fourth interlayer dielectric layer 11e. The second relay electrode 44 is electrically connected to the first relay electrode 42 through the contact hole CNT57 penetrating through the fourth interlayer dielectric layer 11e.

A fifth interlayer dielectric layer 11f is provided on the capacitance line 3b and the second relay electrode 44, with the fourth interlayer dielectric layer 11e therebetween. On the fifth interlayer dielectric layer 11f, the pixel electrode 27, for example formed on an ITO layer, is patterned. The pixel electrode 27 is electrically connected to the pixel electrode-side source/drain region 30d of the semiconductor layer 30a through the second relay electrode 44, the first relay electrode 42, and the second capacitance electrode 16c. An alignment layer (not shown) is provided over the pixel electrode 27.

Manufacturing Method of Liquid Crystal Device

Figure 9:
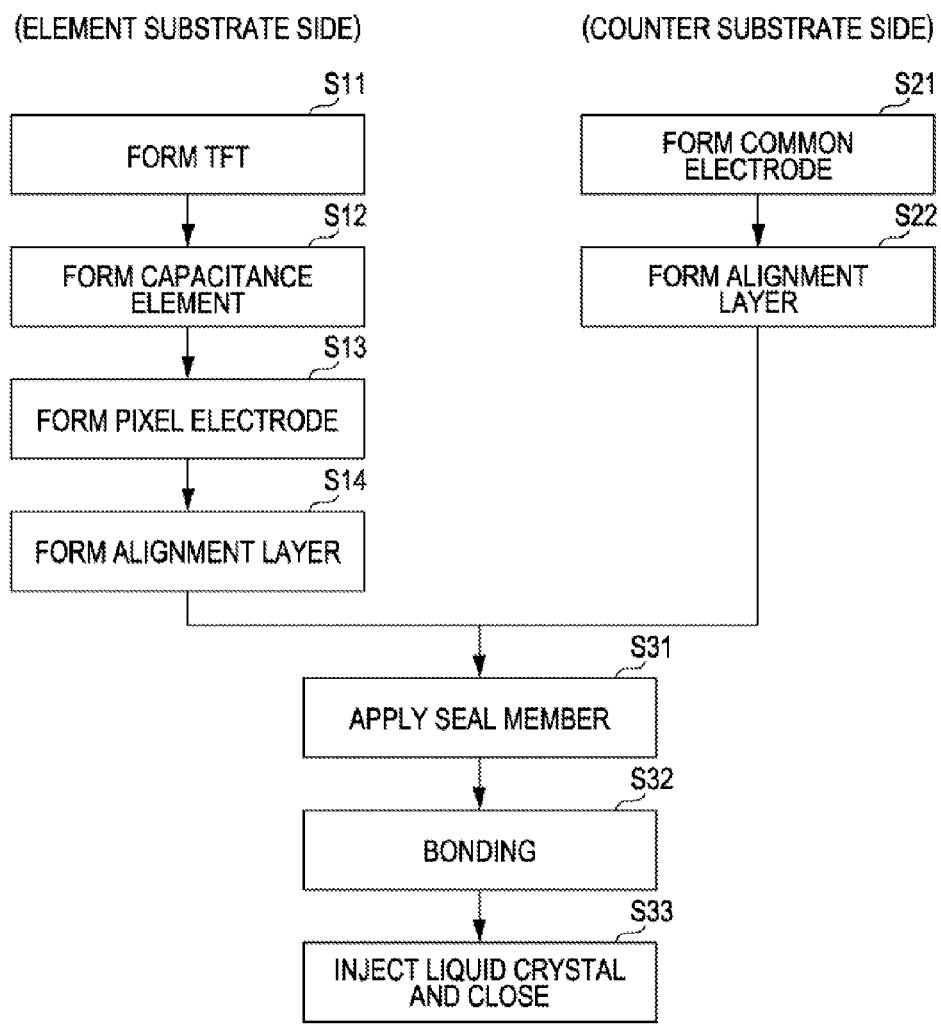
FIG. 9 is a flowchart sequentially showing a manufacturing process of the liquid crystal device.

FIG. 9 is a flowchart sequentially showing a manufacturing process of the liquid crystal device. FIGS. 10A to 11E are schematic cross-sectional views for explaining the manufacturing process of the liquid crystal device. Hereafter, a manufacturing method of the liquid crystal device will be described referring to FIGS. 9 to 11E. Hereafter, the layers formed on the element substrate may be collectively referred to as "element substrate". Likewise, the layers formed on the counter substrate may be collectively referred to as "counter substrate".

First, the manufacturing method of the structure on the side of the element substrate 10 will be described. At a step S11, the TFT 30 is formed on the first substrate 11 constituted of glass, for example. At this step, a deposition technique, a photo lithography technique, and an etching technique that are known may be employed to form the TFT 30 on the first substrate 11.

Figure 10A:
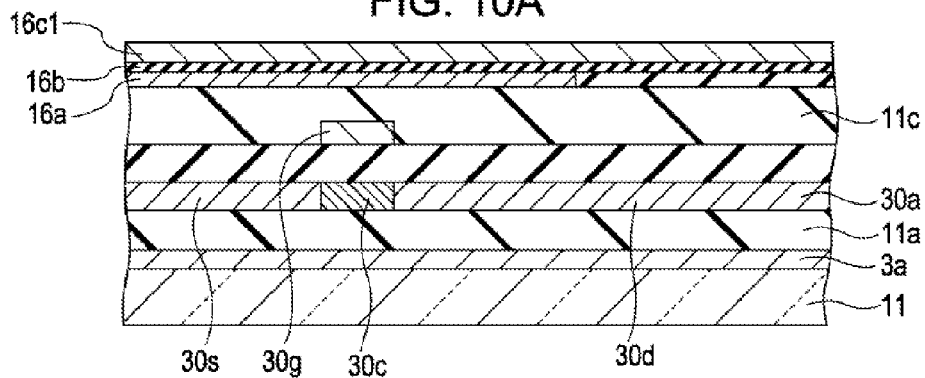
FIGS. 10A to 10C are schematic cross-sectional views for explaining the manufacturing process of the liquid crystal device.

At a step S12, the capacitance element 16 is formed on the TFT 30. Details of this step will be described referring to FIGS. 10A to 11E. First, as shown in FIG. 10A, the first capacitance electrode 16a is patterned on the second interlayer dielectric layer 11c utilizing a deposition technique, a photo lithography technique, and an etching technique that are known. The first capacitance electrode 16a may be formed of polysilicon, in a film thickness of 100 nm.

Then the first dielectric layer 16b is deposited over the entire region. The first dielectric layer 16b is composed of layers of HTO and SiN, for example. After that, the first conductive layer 16c1 constituting a part of the second capacitance electrode 16c is deposited over the entire region. The first conductive layer 16c1 may be formed of polysilicon, in a film thickness of 60 nm.

Figure 10B:
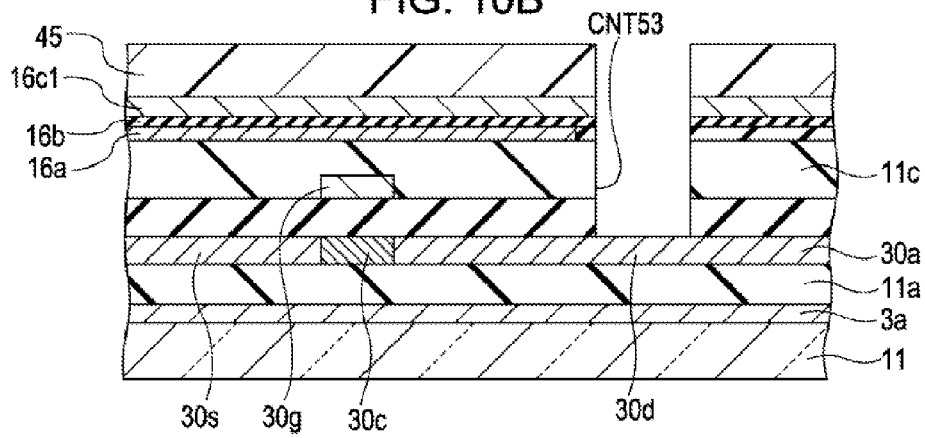

Proceeding to FIG. 10B, the contact hole CNT53 is formed. More specifically, first a resist layer 45 is deposited on the first conductive layer 16c1. Then the resist layer 45 is partially opened by a photo lithography process. After that, the contact hole CNT53 is formed by etching the first conductive layer 16c1, the first dielectric layer 16b, the first capacitance electrode 16a, and the second interlayer dielectric layer 11c, utilizing a resist pattern having openings as the mask. As a result, the contact hole CNT53 is formed so as to reach the pixel electrode-side source/drain region 30d of the semiconductor layer 30a.

Figure 10C:
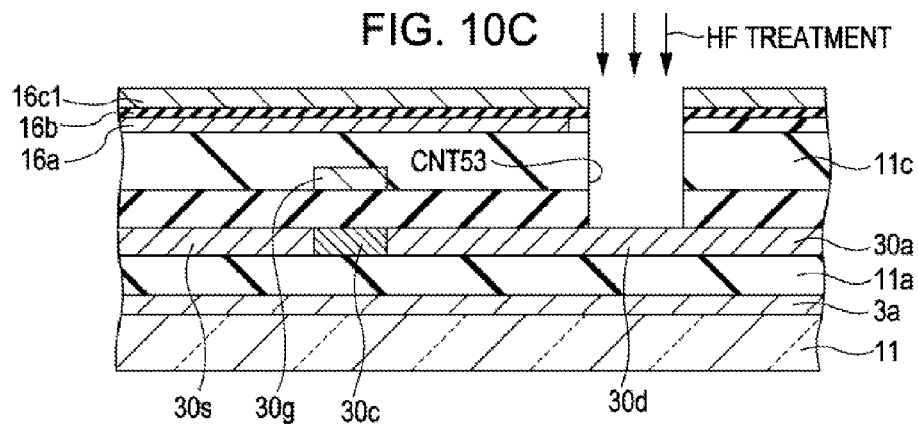

Proceeding to FIG. 10C, the contact hole CNT53 is subjected to, for example, a hydrogen fluoride (HF) treatment. A purpose of this treatment is to remove a natural oxide layer formed on an exposed surface of the semiconductor layer 30a after the contact hole CNT53 is opened. The oxide layer formed inside the contact hole CNT53 can be removed by the HF treatment. Here, although the HF treatment is adopted in this embodiment in order to remove the natural oxide layer, buffered hydrogen fluoride (BHF) or a diluted aqueous solution thereof, or other chemical solutions containing hydrogen fluoride may be employed.

Further, although the withstand voltage of the first dielectric layer 16b may decline because of being subjected to the HF treatment, in this embodiment the first dielectric layer 16b can be prevented from suffering a decline in withstand voltage, since the first dielectric layer 16b is covered with the first conductive layer 16c1.

Figure 11D:
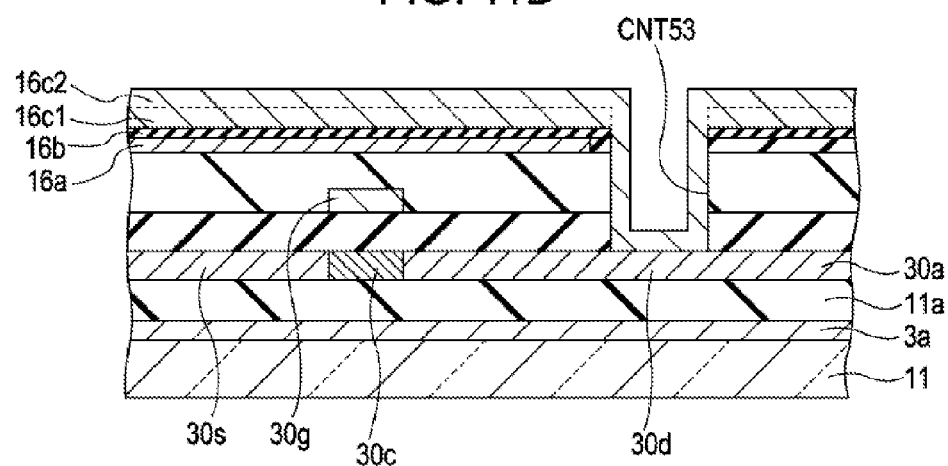
FIGS. 11D and 11E are schematic cross-sectional views for explaining the manufacturing process of the liquid crystal device.

Proceeding to FIG. 11D, the second conductive layer 16c2 is deposited so as to cover the first conductive layer 16c1 and the contact hole CNT53. The second conductive layer 16c2 may be formed of polysilicon, in a film thickness of 60 nm. At this stage, the second conductive layer 16c2 is stacked on the first conductive layer 16c1 so as to form the second capacitance electrode 16c, and the inner surface of the contact hole CNT53 is covered with the second conductive layer 16c2. Accordingly, electrical connection is secured between the second capacitance electrode 16c and the pixel electrode-side source/drain region 30d.

Figure 11E:
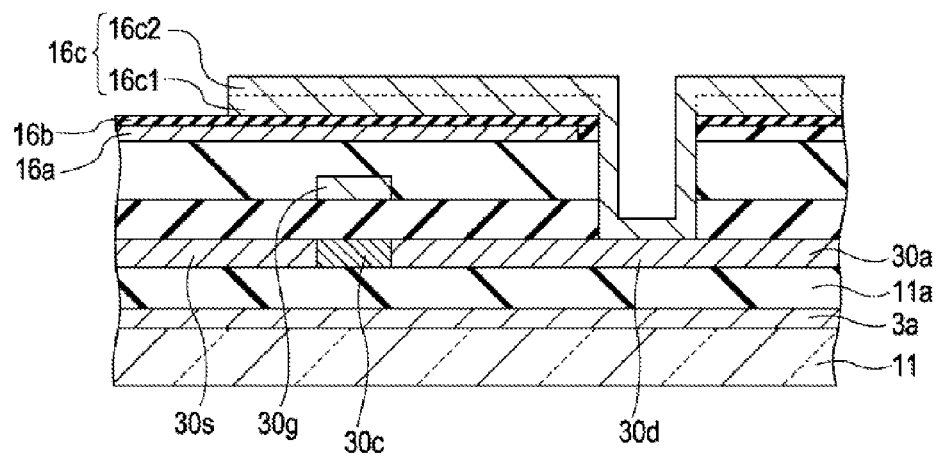

Proceeding to FIG. 11E, the second capacitance electrode 16c, composed of the first conductive layer 16c1 and the second conductive layer 16c2, is patterned. At this stage, the formation of the second capacitance electrode 16c is completed. Although not shown, thereafter the second dielectric layer 16d and the third capacitance electrode 16e are formed by patterning, so that the capacitance element 16 including the pair of capacitance elements 116, 216 connected in parallel is obtained.

At a step S13, the pixel electrode 27 is formed. More specifically, the pixel electrode 27, formed of ITO for example, is formed on the fifth interlayer dielectric layer 11f by known photo lithography and etching techniques.

At a step S14, the alignment layer 28 is formed on the pixel electrode 27. To form the alignment layer 28, for example an oblique vapor deposition process may be employed, in which an inorganic material such as silicon oxide ($SiO_2$) is obliquely deposited. At this stage, the structure on the side of the element substrate 10 is completed.

The manufacturing method of the structure on the side of the counter substrate 20 will now be described. First, at a step S21, the common electrode 31 is formed on the second substrate 12 constituted of a light-transmissive material such as glass, by a deposition technique, a photo lithography technique, and an etching technique that are known.

At a step S22, the alignment layer 32 is formed on the common electrode 31. The alignment layer 32 may be formed in the same way as the alignment layer 28, and for example an oblique vapor deposition may be employed. At this stage, the structure on the side of the counter substrate 20 is completed. Hereunder, a method of bonding the element substrate 10 and the counter substrate 20 together will be described.

At a step S31, the seal member 14 is applied to the element substrate 10. At this step, the element substrate 10 is relatively moved with respect to a dispenser, so as to apply the seal member 14 along the periphery of the display region E on the element substrate 10 (so as to surround the display region E).

At a step S32, the element substrate 10 and the counter substrate 20 are bonded together, with the seal member 14 applied to the element substrate 10 interposed therebetween. In this process, the positional relationship between the substrates 10 and 20 is accurately adjusted in both longitudinal and widthwise directions.

At a step S33, liquid crystal injected into inside the bonded substrates through a liquid crystal inlet (not shown), after which the liquid crystal inlet is tightly closed, for example with an encapsulating material such as a resin. At this stage, the liquid crystal device 100 is obtained.

Figure 12:
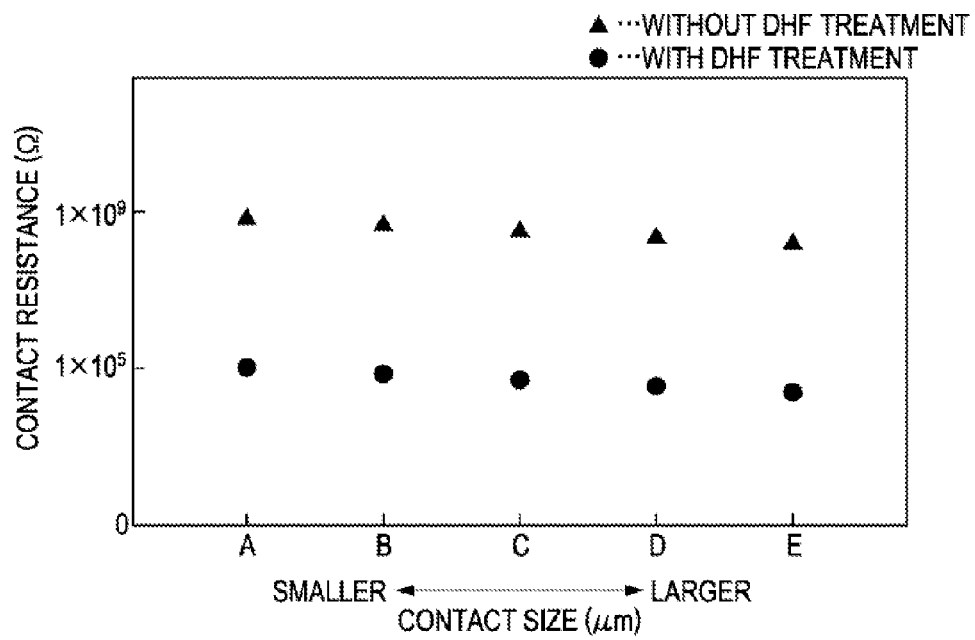
FIG. 12 is a graph showing a relationship between contact sizes and contact resistance, in the cases where a hydrogen fluoride (HF) treatment has been and has not been applied to the contact hole connecting the capacitance element and the semiconductor layer.

FIG. 12 is a graph showing a relationship between contact sizes and contact resistance, in the cases where the HF treatment has been and has not been applied to the contact holes connecting the capacitance element and the semiconductor layer. Hereunder, the relationship between the contact size and the contact resistance will be described referring to FIG. 12.

In the graph shown in FIG. 12, the horizontal axis represents the contact size, indicating a larger value toward the right. The vertical axis represents the contact resistance, indicating a larger value toward the upper side.

From FIG. 12, it is understood that, in the case where the HF treatment is not performed in the process shown in FIG. 10C, the contact holes of five different sizes all show a resistance of approximately $1 \times 10^9 (\Omega)$. In contrast, in the case where the HF treatment is performed as in this embodiment, the contact holes of five different sizes show a resistance of approximately $1 \times 10^5 (\Omega)$.

Thus, performing the HF treatment after forming the contact hole CNT53 enables the natural oxide layer ($SiO_2$) formed on the semiconductor layer 30a to be removed, and the contact resistance to be reduced. Consequently, degradation in electrical characteristics can be prevented.

Figure 13:
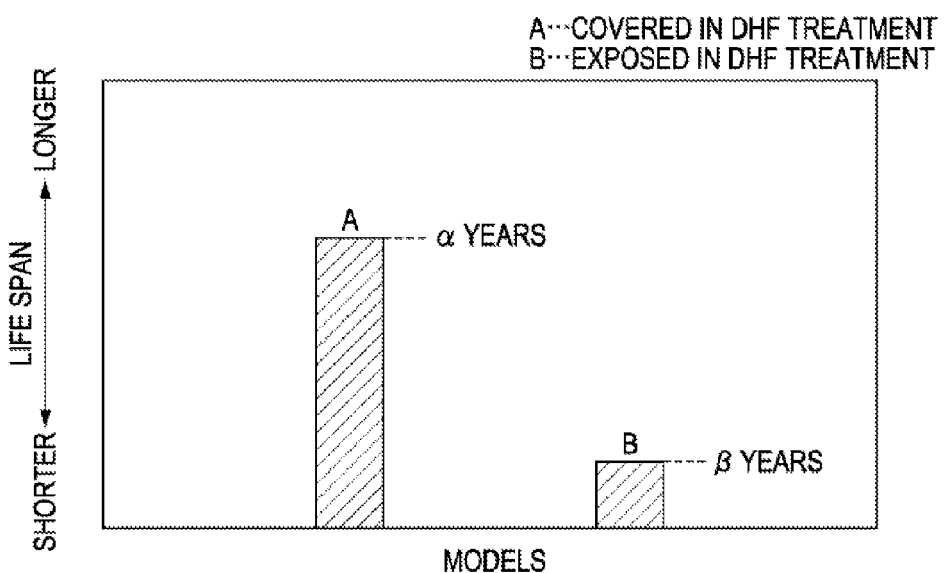
FIG. 13 is a graph showing a difference in life span between liquid crystal devices, one of which had a first dielectric layer covered with a first conductive layer during the HF treatment, and the other of which did not.

FIG. 13 is a graph showing a difference in life span between the liquid crystal devices, one of which had the first dielectric layer covered with the first conductive layer during the HF treatment, and the other of which did not. Hereunder, the life span of the liquid crystal device will be described referring to FIG. 13.

In the graph shown in FIG. 13, the horizontal axis represents models of the liquid crystal device 100. The model A is the liquid crystal device 100 subjected to the HF treatment with the first dielectric layer 16b being covered with the first conductive layer 16c1. The model B is the liquid crystal device 100 subjected to the HF treatment with the first dielectric layer 16b left exposed. The vertical axis represents the life span (years) of the liquid crystal device 100.

From FIG. 13, it is understood that, in the case where the HF treatment is performed as in this embodiment with the first dielectric layer 16b being covered with the first conductive layer 16c1 in the process shown in FIG. 10C, the life span is α years. In contrast, in the case where the HF treatment is performed with the first dielectric layer 16b left exposed as in the conventional process, the life span is β years, which is approximately 1/1000 of α years.

As is apparent from the above, performing the HF treatment with the first dielectric layer 16b constituting a part of the capacitance element 16 being covered with the first conductive layer 16c1 which is a part of the second capacitance electrode 16c allows the contact resistance to reduced and the life span of the capacitance element 16, hence the liquid crystal device 100, to be prolonged.

Configuration of Electronic Apparatus

Figure 14:
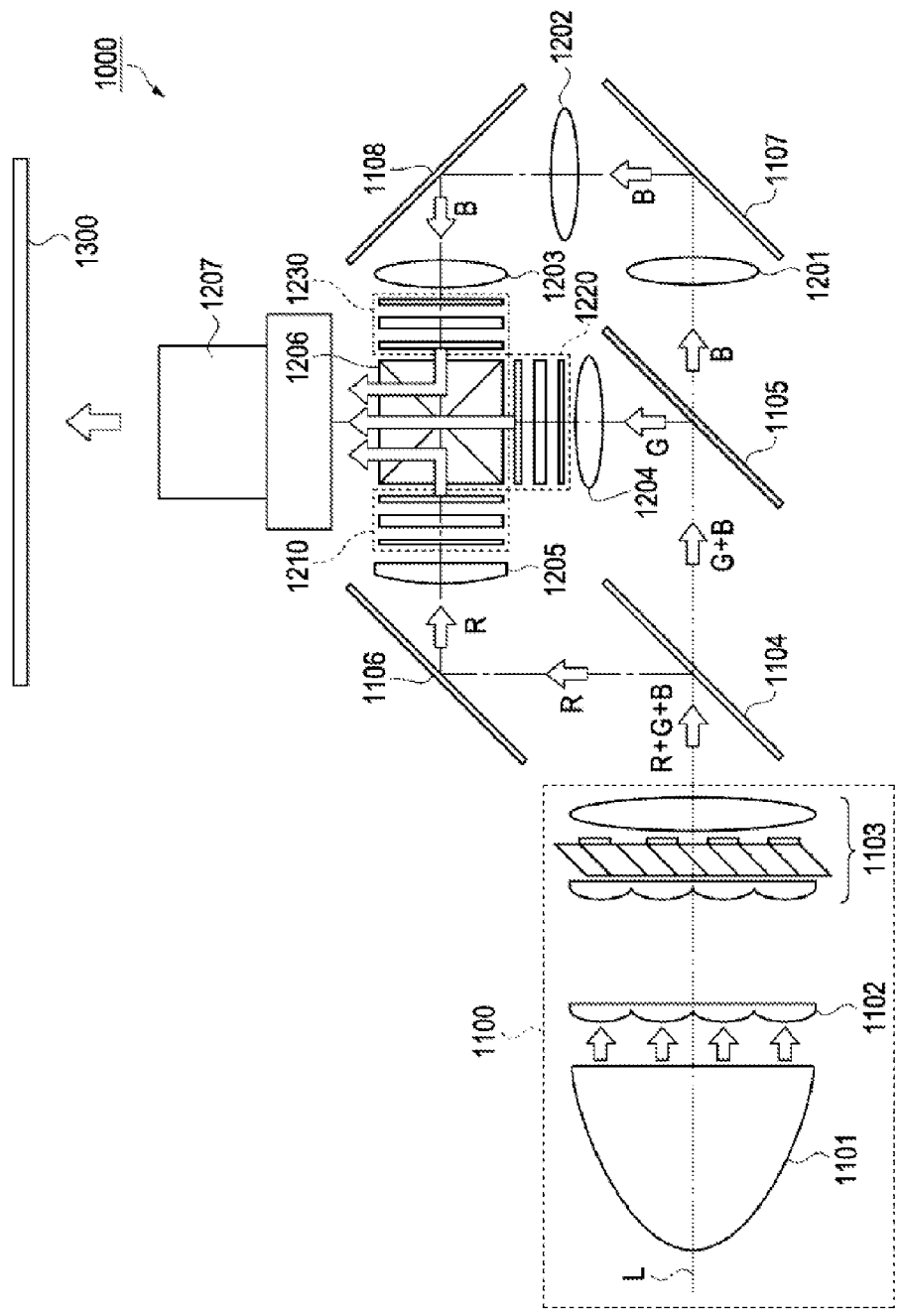
FIG. 14 is a schematic plan view of a projector exemplifying an electronic apparatus that includes the electro-optical apparatus.

FIG. 14 is a schematic plan view of a projector exemplifying an electronic apparatus that includes the liquid crystal device. Hereunder, the configuration of the projector including the liquid crystal device will be described referring to FIG. 14.

As shown in FIG. 14, the projector 1000 exemplifying the electronic apparatus according to this embodiment includes a polarizing illumination device 1100 disposed along a system optical axis L, a pair of dichroic mirrors 1104, 1105 serving as optical splitters, three reflection mirrors 1106, 1107, and 1108, five relay lenses 1201, 1202, 1203, 1204, and 1205, three transmissive liquid crystal light bulbs 1210, 1220, and 1230 serving as optical modulators, a cross dichroic prism 1206 serving as an optical synthesizer, and a projection lens 1207.

The polarizing illumination device 1100 essentially includes a lamp unit 1101 serving as the light source, including a white light source such as a ultra-high pressure mercury lamp or halogen lamp, an integrator lens 1102, and a polarizing conversion element 1103.

The dichroic mirror 1104 reflects red light (R) and transmits green (G) and blue (B) light, out of the polarized flux outputted from the polarizing illumination device 1100. The other dichroic mirror 1105 reflects the green light (G) transmitted through the dichroic mirror 1104, and transmits the blue light (B).

The red light (R) reflected by the dichroic mirror 1104 is reflected by the reflection mirror 1106 and then incident into the liquid crystal light bulb 1210 through the relay lens 1205. The green light (G) reflected by the dichroic mirror 1105 is incident into the liquid crystal light bulb 1220 through the relay lens 1204. The blue light (B) transmitted through the dichroic mirror 1105 is incident into the liquid crystal light bulb 1230 through the light guide system composed of the three relay lenses 1201, 1202, and 1203 and two reflection mirrors 1107, 1108.

The liquid crystal light bulbs 1210, 1220, and 1230 are each disposed so as to oppose an incident surface of the cross dichroic prism 1206 corresponding to one of R, G, and B. The light of R, G, and B incident into the liquid crystal light bulbs 1210, 1220, 1230 is modulated in accordance with image information (image signal) and outputted to the cross dichroic prism 1206. The cross dichroic prism 1206 is composed of four right-angled prisms combined together, and a dielectric multilayered film that reflects red light and a dielectric multilayered film that reflects blue light are disposed in a cross-shape inside the prism. The light of R, G, and B is synthesized by these dielectric multilayered films, so as to generate the light that represents the color image. The light thus synthesized is projected on a screen 1300 through the projection lens 1207 constituting a projecting optical system, so that the enlarged image is displayed.

The foregoing liquid crystal device 100 is incorporated in the liquid crystal light bulb 1210. The liquid crystal device 100 is located between a pair of polarizers disposed in a cross-Nicole configuration at the input side and output side, with a spacing from the polarizers. The liquid crystal light bulbs 1220 and 1230 are also configured in the same way.

The thus configured projector 1000 constitutes an electronic apparatus capable of improving display quality by employing a liquid crystal module that includes the foregoing liquid crystal device 100.

As described in details thus far, the liquid crystal device 100, the manufacturing method thereof, and the electronic apparatus according to this embodiment provide the following advantageous effects.

(1) With the liquid crystal device 100 and the manufacturing method thereof according to this embodiment, the second capacitance electrode 16c includes the two conductive layers namely the first conductive layer 16c1 and the second conductive layer 16c2, and the contact hole CNT53 and the second conductive layer 16c2 are formed with the first dielectric layer 16b being covered with the first conductive layer 16c1. Accordingly, even when, for example, a natural oxide layer is formed on the semiconductor layer 30a inside the contact hole CNT53 after the contact hole CNT53 is formed and then a DHF treatment is performed so as to remove the natural oxide layer, the first dielectric layer 16b can be prevented from being exposed to the hydrogen fluoride because the first dielectric layer 16b is covered with the first conductive layer 16c1, and therefore the natural oxide layer can be removed without compromising the withstand voltage of the first dielectric layer 16b. Further, the second conductive layer 16c2 formed on the first conductive layer 16c1 and inside the contact hole CNT53 allows the capacitance element 16 and the semiconductor layer 30a (30d) to be electrically connected to each other.

(2) With the liquid crystal device 100 and the manufacturing method thereof according to this embodiment, the second conductive layer 16c2 constituting a part of the second capacitance electrode 16c and the third capacitance electrode 16e opposing each other with the second dielectric layer 16d therebetween can serve as the second capacitance element 216. Accordingly, a pair of capacitance elements 116 and 216 can be obtained, the former being composed of the first capacitance electrode 16a and the first conductive layer 16c1, and the latter being composed of the second conductive layer 16c2 and the third capacitance electrode 16e, in other words, a pair of capacitance elements 116, 216 connected in parallel can be obtained, which leads to an increase in capacitance value per unit area.

(3) The electronic apparatus according to this embodiment allows, because of including the foregoing liquid crystal device 100, the potential of each of the pixel electrodes 27 to be securely retained, thereby improving the display quality.

The invention is not limited to the foregoing embodiment but may be modified within the scope and spirit of the invention expressed in the present disclosure and the appended claims, and all such modifications are included in the technical scope of the invention. To cite a few examples, the invention may be realized as follows.

Variation 1

Although the electro-optical apparatus is exemplified by the liquid crystal device 100 in the foregoing description, the electro-optical apparatus may also be realized as display apparatuses such as an electro-luminescence (EL) device and an electrophoretic device. Further, the invention may be applied to a reflective liquid crystal-on-silicon (LCOS) device, a plasma display panel (PDP), a field emission display (FED) including a surface-conduction electron-emitter display (SED), a digital micromirror device (DMD), and so forth.

Variation 2

Although the projector 1000 is taken up as an example of the electronic apparatus in the foregoing description, the invention may also be applied to a viewer, a view finder, a head-mounted display, and the like. Further, the invention may be applied to electronic apparatuses such as a liquid crystal TV, a mobile phone, an electronic organizer, a word processor, a view-finder type or direct-view video recorder, a work station, a portable personal computer, a TV phone, a POS terminal, a pager, a pocket calculator, and a touch panel, electrophoretic devices such as an electronic paper, a car navigation system, and so forth.

The entire disclosure of Japanese Patent Application No.2011-218978, filed Oct. 3, 2011 is expressly incorporated by reference herein.

What is claimed is:

1. An electro-optical apparatus, comprising:
a transistor; and
a capacitance element electrically connected to the transistor,
wherein the capacitance element includes:
a first capacitance electrode formed over the transistor with an insulating interlayer therebetween;
a second capacitance electrode formed so as to oppose the first capacitance electrode with a first capacitance insulation layer therebetween, the second capacitance electrode being electrically connected to a semiconductor layer of the transistor through a contact hole formed in the insulating interlayer,
the second capacitance electrode includes a first conductive layer and a second conductive layer stacked on the first conductive layer,
a portion of the first conductive layer overlapping the contact hole is removed, and the second conductive layer and the semiconductor layer of the transistor are electrically connected to each other through the contact hole,
a second capacitance insulation layer formed on the second capacitance electrode on the side thereof opposite the first capacitance insulation layer, and
a third capacitance electrode disposed so as to oppose the second capacitance electrode with the second capacitance insulation layer therebetween,
a first insulation layer formed so as to cover an end portion of the first capacitance electrode, the first insulation layer being formed at a position between the end portion of the first capacitance electrode and the first conductive layer of the second capacitance electrode, and
a second insulation layer formed so as to cover an end portion of the second capacitance electrode, the second insulation layer being formed at a position between the second conductive layer of the second capacitance electrode and the third capacitance electrode.

2. An electronic apparatus comprising the electro-optical apparatus according to claim 1.

3. The electro-optical apparatus according to claim 1, wherein the first capacitance electrode and the third capacitance electrode are each electrically connected to a capacitance line.

* * * * *